US007750420B2

(12) United States Patent
Field et al.

(10) Patent No.: US 7,750,420 B2
(45) Date of Patent: Jul. 6, 2010

(54) INTEGRATED CIRCUIT HAVING ONE OR MORE CONDUCTIVE DEVICES FORMED OVER A SAW AND/OR MEMS DEVICE

(75) Inventors: Dean L. Field, Graham, WA (US); Charles N. Stone, Leander, TX (US); Michael W. Bruner, Saratoga, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 473 days.

(21) Appl. No.: 11/089,921

(22) Filed: Mar. 24, 2005

(65) Prior Publication Data

US 2005/0214974 A1    Sep. 29, 2005

Related U.S. Application Data

(60) Provisional application No. 60/556,812, filed on Mar. 26, 2004.

(51) Int. Cl.
   *H01L 29/78*    (2006.01)
(52) U.S. Cl. .................. 257/416; 257/414; 310/313 R; 310/313 B
(58) Field of Classification Search ................. 257/416; 310/313 R, 313 B
   See application file for complete search history.

(56) References Cited

U.S. PATENT DOCUMENTS

| 5,548,099 | A | 8/1996 | Cole, Jr. et al. |
| 5,712,523 | A | 1/1998 | Nakashima et al. |
| 5,747,857 | A | 5/1998 | Eda et al. |
| 5,747,874 | A | 5/1998 | Seki et al. |
| 5,760,522 | A | 6/1998 | Kobayashi et al. |
| 5,777,422 | A | 7/1998 | Kitabayashi et al. |
| 5,786,738 | A | 7/1998 | Ikata et al. |
| 5,815,900 | A | 10/1998 | Ichikawa et al. |

(Continued)

FOREIGN PATENT DOCUMENTS

EP    1 433 742    6/2004

(Continued)

OTHER PUBLICATIONS

C.K. Campbell, "15.3 SAW In-Line IF Resonator-Filters," Surface Acoustic Wave Devices for Mobile and Wireless Communications, 1998, pp. 439-457.

(Continued)

*Primary Examiner*—Kenneth A Parker
*Assistant Examiner*—Jose R Diaz

(57) ABSTRACT

An integrated circuit is provided which includes one or more device elements formed above a base substrate, a structure forming a sealed cavity above at least a portion of the one or more device elements, and one or more conductive devices formed above the sealed cavity. A method for fabrication of such an integrated circuit is also provided. An exemplary embodiment of the integrated circuit includes a surface acoustic wave device having a plurality of tracks each with a first interdigitated transducer configured to convert a receiving electric field energy into mechanical wave energy and a second interdigitated transducer configured to convert the mechanical wave energy into an output electric field energy. The SAW device also includes a conductor arranged above and spanning across at least two tracks of the plurality of tracks and coupled to the first interdigitated transducers of at least the two tracks.

10 Claims, 4 Drawing Sheets

U.S. PATENT DOCUMENTS

| | | | |
|---|---|---|---|
| 5,831,369 | A | 11/1998 | Furbacher et al. |
| 5,859,473 | A | 1/1999 | Ikata et al. |
| 5,872,331 | A | 2/1999 | Ando et al. |
| 5,919,548 | A | 7/1999 | Barron et al. |
| 5,963,788 | A * | 10/1999 | Barron et al. ............ 438/48 |
| 5,991,989 | A | 11/1999 | Onishi et al. |
| 6,018,211 | A | 1/2000 | Kanaboshi et al. |
| 6,022,759 | A | 2/2000 | Seki et al. |
| 6,078,608 | A | 6/2000 | Ohtsuka et al. |
| 6,105,226 | A | 8/2000 | Gore et al. |
| 6,115,592 | A | 9/2000 | Ueda et al. |
| 6,136,175 | A | 10/2000 | Steizi et al. |
| 6,154,940 | A | 12/2000 | Onishi et al. |
| 6,265,807 | B1 | 7/2001 | Koga et al. |
| 6,377,137 | B1 | 4/2002 | Ruby |
| 6,388,545 | B1 | 5/2002 | Kawachi et al. |
| 6,413,852 | B1 | 7/2002 | Grill et al. |
| 6,414,415 | B1 | 7/2002 | Shibutani et al. |
| 6,417,574 | B1 | 7/2002 | Misawa et al. |
| 6,426,583 | B1 | 7/2002 | Onishi et al. |
| 6,437,412 | B1 | 8/2002 | Higuchi et al. |
| 6,446,316 | B1 | 9/2002 | Furbacher et al. |
| 6,455,980 | B1 | 9/2002 | Bernstein |
| 6,456,172 | B1 | 9/2002 | Ishizaki et al. |
| 6,498,422 | B1 | 12/2002 | Hori |
| 6,509,623 | B2 | 1/2003 | Zhao |
| 6,519,822 | B1 | 2/2003 | Steizi et al. |
| 6,528,924 | B1 | 3/2003 | Steizi et al. |
| 6,550,664 | B2 | 4/2003 | Bradley et al. |
| 6,570,469 | B2 | 5/2003 | Yamada et al. |
| 6,573,121 | B2 | 6/2003 | Yoneda et al. |
| 6,573,635 | B2 | 6/2003 | Suga et al. |
| 6,666,371 | B2 | 12/2003 | Nakazawa et al. |
| 6,770,822 | B2 | 8/2004 | Pasternak et al. |
| 6,800,912 | B2 | 10/2004 | Ozgur |
| 6,846,423 | B1 | 1/2005 | Miller et al. |
| 6,861,608 | B2 | 3/2005 | Koduri et al. |
| 6,877,209 | B1 | 4/2005 | Miller et al. |
| 6,931,699 | B2 | 8/2005 | Pahl et al. |
| 6,976,295 | B2 | 12/2005 | Kikushima et al. |
| 6,992,420 | B2 | 1/2006 | Jang et al. |
| 7,045,459 | B2 | 5/2006 | Freidhoff |
| 7,151,426 | B2 | 12/2006 | Stafford et al. |
| 7,211,934 | B2 * | 5/2007 | Fujiwara et al. ............ 310/348 |
| 7,291,547 | B2 * | 11/2007 | Timme et al. ............ 438/612 |
| 2001/0010444 | A1 | 8/2001 | Pahl et al. |
| 2002/0173080 | A1 | 11/2002 | Saia et al. |
| 2003/0155643 | A1 | 8/2003 | Freidhoff |
| 2003/0183916 | A1 | 10/2003 | Heck et al. |
| 2004/0100164 | A1 * | 5/2004 | Murata et al. ............ 310/348 |
| 2004/0227431 | A1 * | 11/2004 | Mishima ............ 310/313 R |
| 2004/0245586 | A1 | 12/2004 | Partridge et al. |

FOREIGN PATENT DOCUMENTS

| | | |
|---|---|---|
| EP | 1 458 094 | 9/2004 |
| JP | 402299311 A1 | 12/1990 |
| JP | 09 172339 A1 | 6/1997 |
| JP | 2001185976 | 7/2001 |
| JP | 2004039868 | 2/2004 |
| WO | 2004/021398 | 3/2004 |

OTHER PUBLICATIONS

International Search Report, PCT/US2005/009887, mailed Jul. 12, 2005.

International Written Opinion of the International Search Report for International Application No. PCT/US2005/009887 dated Jul. 8, 2005; 7 pages.

USPTO Notice of Allowance for U.S. Appl. No. 10/231,356 dated May 3, 2004; 6 pages.

USPTO Non-Final Rejection for U.S. Appl. No. 10/231,356 dated Feb. 6, 2004; 8 pages.

USPTO Requirement for Restriction/Election for U.S. Appl. No. 10/231,356 dated Oct. 31, 2003; 4 pages.

USPTO Notice of Allowance for U.S. Appl. No. 10/821,357 dated Feb. 13, 2009; 13 pages.

USPTO Advisory Action for U.S. Appl. No. 10/821,357 dated Dec. 16, 2008; 3 pages.

USPTO Final Rejection for U.S. Appl. No. 10/821,357 dated May 29, 2008; 12 pages.

USPTO Non-Final Rejection for U.S. Appl. No. 10/821,357 dated Dec. 11, 2007; 11 pages.

USPTO Final Rejection for U.S. Appl. No. 10/821,357 dated Jul. 25, 2006; 11 pages.

USPTO Non-Final Rejection for U.S. Appl. No. 10/821,357 dated Mar. 11, 2006; 10 pages.

USPTO Notice of Allowance for U.S. Appl. No. 10/231,357 dated Sep. 29, 2004; 6 pages.

USPTO Non-Final Rejection for U.S. Appl. No. 10/231,357 dated Apr. 21, 2004; 8 pages.

USPTO Notice of Allowance for U.S. Appl. No. 11/041,857 dated Sep. 29, 2008; 5 pages.

USPTO Notice of Allowance for U.S. Appl. No. 11/041,857 dated Jul. 31, 2008; 8 pages.

USPTO Final Rejection for U.S. Appl. No. 11/041,857 dated Mar. 26, 2008; 7 pages.

USPTO Non-Final Rejection for U.S. Appl. No. 11/041,857 dated Sep. 18, 2007; 6 pages.

King et al., "SAW Filters in CDMA Mobile Communication Networks," Wireless Technologies China 1999, Conference Proceedings, pp. 104-107, Sawtech Inc.; 4 pages.

Ando et al., "New Packaging Technology for SAW Device," Electronic Manufacturing Technology Symposium, Dec. 1995, pp. 403-406; 4 pages.

International Search Report of the Searching Authority for International Application No. PCT/US03/18103 dated Mar. 26, 2004; 3 pages.

Extract from the Register of European Patents for European Application No. EP 03 79 1559, printed Feb. 2010; 3 pages.

"Emphasis," American Competitiveness Institute, Aug. 2001, <http://www.empf.org/html/August_2110.pdf>; 12 pages.

"The First Office Action" from China Patent Office for Patent Application No. 03823717.2 dated Nov. 9, 2007; 7 pages.

* cited by examiner

INTEGRATED CIRCUIT HAVING ONE OR MORE CONDUCTIVE DEVICES FORMED OVER A SAW AND/OR MEMS DEVICE

PRIORITY APPLICATION

The present application claims priority to provisional application No. 60/556,812 entitled "Multiple Level Conductors on SAW or MEM Devices," filed Mar. 26, 2004.

BACKGROUND OF THE INVENTION

1. Field of the Invention

The present invention relates generally to microelectronic device fabrication and, more particularly, the fabrication of a SAW device and/or a MEMS device having one or more conductive devices formed thereover.

2. Description of the Related Art

The following descriptions and examples are given as background information only.

Microelectronic devices have been developed for a diversity of applications using a variety of technologies. Some exemplary microelectronic devices include surface acoustic wave (SAW) devices and micro electromechanical system (MEMS) devices. SAW devices exploit the propagation properties of waves along the surface or the near surface of a substrate. Changes in velocity and/or amplitude of the waves correlate to physical parameters and, therefore, may be monitored to serve as a sensor. SAW devices are often used as bandpass filters in communication devices, such as mobile phone handsets and communication networks, for example. Other applications of SAW devices include but are not limited to torque sensors, pressure sensors, humidity sensors and temperature sensors. MEMS devices integrate electromechanical functions using mechanical moving structures formed upon wafers. MEMS devices are of interest in part because of their potential for providing miniaturized sensors and actuators and performing functions not done or poorly done by technologies including fixed structures formed upon semiconductor wafers. Examples of MEMS devices include but are not limited to switching devices used in optical telecommunications cables and sensing devices used to control the deployment of airbags in automobiles.

One challenge associated with both SAW and MEMS devices is that free areas are needed for the mechanical properties of the devices. Because of this restriction, other conductors and devices cannot be easily formed above SAW or MEMS devices. Consequently, SAW or MEMS devices are generally not integrated on the same chip with other conductive structures. Rather, additional conductors or circuits are generally formed external to the substrate upon which a SAW or MEMS device is fabricated and are often formed external to the device package. In cases in which additional conductors or circuits are fabricated on the same chip as SAW or MEMS devices, the additional devices must be laterally disposed across the chip, leading to undesirably large die sizes. Another predicament with SAW and MEMS devices is that the active regions of the devices can be very sensitive to the presence of surface contaminants. Surface contaminants may, for example, alter the wave velocities of a SAW device or modify the voltage level at which a moving part with a MEMS device is brought into contact or released from a contact pad. As a consequence, device performance may be degraded for the SAW device or MEMS device. Even a monolayer of contaminant on the surface of a SAW or MEMS device can noticeably alter device performance.

Accordingly, it would be beneficial to develop an architecture which includes a SAW and/or MEMS device integrally fabricated with one or more other conductive devices on a single substrate and which does not require an undesirably large die size. In addition, it would be advantageous to inhibit the formation of contaminants within the active region of the SAW or MEMS device during the formation of the architecture.

SUMMARY OF THE INVENTION

The problems outlined above may be in large part addressed by an integrated circuit including a surface acoustic wave device and/or a micro electromechanical system device having one or more conductive devices formed thereover. The following are mere exemplary embodiments of the integrated circuit and an exemplary method of fabricating the integrated circuit and are not to be construed in any way to limit the subject matter of the claims.

One embodiment of the integrated circuit includes one or more device elements formed above a base substrate, a structure forming a sealed cavity above at least a portion of the one or more device elements, and one or more conductive devices formed above the sealed cavity.

Another embodiment of the integrated circuit includes a surface acoustic wave device having a plurality of tracks each with a first interdigitated transducer configured to convert a receiving electric field energy into mechanical wave energy and a second interdigitated transducer configured to convert the mechanical wave energy into an output electric field energy. The SAW device also includes a conductor arranged above and spanning across at least two tracks of the plurality of tracks and coupled to the first interdigitated transducers of at least the two tracks.

An embodiment of the method for fabricating the integrated circuit includes forming one or more device elements above a substrate and enclosing at least a portion of the one or more device elements within a sealed cavity. The method further includes depositing a conductive layer above the sealed cavity and patterning the conductive layer to form a conductive device above the sealed cavity.

BRIEF DESCRIPTION OF THE DRAWINGS

These and various other features and advantages of the present invention will be apparent upon reading of the following detailed description in conjunction with the accompanying drawings and the appended claims provided below, where:

Figure 1:
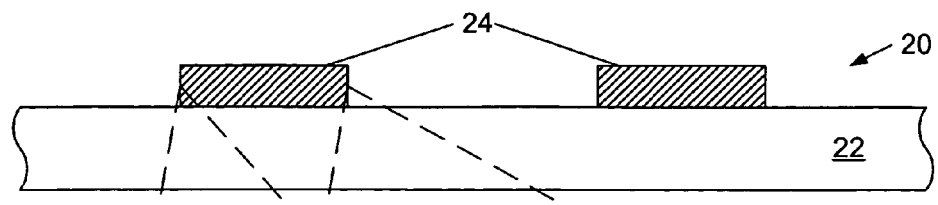
FIG. 1 is a partial cross-sectional view of a topography configured for fabrication of an integrated circuit including device elements formed above a base substrate.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, an exemplary method for fabricating an integrated circuit including a surface acoustic wave (SAW) device and/or a micro electromechanical system (MEMS) device having one or more conductive devices formed thereover is provided. In particular, FIGS. 1-10 depict a process in which one or more device elements of a SAW device and/or a MEMS device are formed within a sealed cavity and one or more conductive features are formed thereover. As shown in FIG. 1, topography 20 includes device elements 24 arranged upon base substrate 22. As described in more detail below, device elements 24 are general reference blocks representing one of more conductive features of a SAW device or a MEMS device. In reference thereto, it is noted that the components of topography 20 are not drawn to scale in FIG. 1 nor in FIGS. 2-11. For instance, the aggregate thickness of components among each of device elements 24 may be on the order of thousands of angstroms to a few microns, while the thickness of base substrate 22 may be on the order of hundreds of microns.

For the fabrication of a SAW device, base substrate 22 may generally include a material which enables acoustic waves to travel elastically across its surface, such as lithium tantalate, lithium niobate, or single crystal quartz, for example. On the other hand, for the fabrication of MEMS devices, base substrate 22 may include a semiconductor material, such as a silicon, ceramic, or gallium arsenide. Alternatively, base substrate 22 may be glass, polyimide, metal, or any other substrate material commonly used in the fabrication of MEMS devices. In some cases, base substrate 22 may include a silicon on insulator (SOI) layer or an epitaxial silicon layer grown on a monocrystalline silicon substrate for the fabrication of MEMS devices.

Figure 2A:
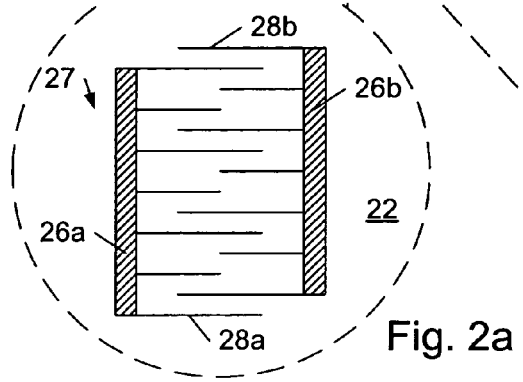
FIG. 2a is a partial top view of one of the device elements depicted in FIG. 1 including an interdigitated transducer of an ensuing surface acoustic wave device.
Figure 2B:
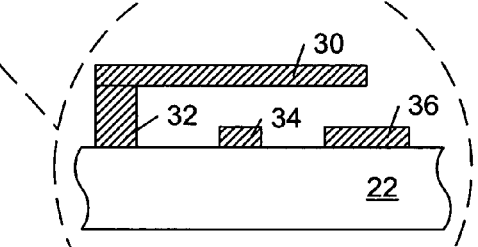
FIG. 2b is a partial cross-sectional view of one of the device elements depicted in FIG. 1 including a structure suspended above a contact pad of an ensuing micro electro-mechanical device.

In general, the composition and configuration of device elements 24 depends on the device being formed, namely a SAW device or a MEMS device. Some exemplary component configurations of device elements 24 for a SAW device and a MEMS device are shown in FIGS. 2a and 2b, respectively, and described in more detail below. It is noted, however, that the integrated circuits and method of fabrication described herein are not necessarily so restricted. In particular, device elements 24 may include any configuration of components for SAW and MEMS devices known to those skilled in such industries. Furthermore, device elements 24 may include components in addition to the components specifically configured for a SAW or MEMS device, such as for example, line traces for connection to input/output pads or ground contacts. Moreover, although two device elements are shown upon base substrate 22, topography 20 may include any number of device elements, including a single device element or more than two device elements. As will be discussed in more detail below, device elements 24 may collectively serve as a SAW device or MEMS device, or may serve as separate devices, depending on the operating attributes of the components comprising device elements 24 and the design specifications of the ensuing device. As such, although portions of device elements 24 are sealed with a single cavity as described below in reference to FIGS. 3-7, portions of device elements 24 may alternatively be formed in multiple cavities or portion of only one of device elements 24 may be formed within a sealed cavity.

As noted above, FIG. 2a illustrates an exemplary configuration of components which may be used for a SAW device. In particular, FIG. 2a shows a partial top view of topography 20 having interdigitated transducer (IDT) 27 arranged upon base substrate 22. In general, IDT 27 may be patterned from a metal such as aluminum for example. The general function of IDTs within SAW devices is to convert electrical field energies to mechanical wave energies and vice versa. In particular, IDTs may be used to convert electrical signals received on bus bars to mechanical waves which propagate along the surface or near the surface of an underlying substrate. In addition, IDTs may be used to receive mechanical waves propagating along the surface of the substrate and covert them into output electrical field energies. In either case, wave propagation may occur in areas between electrodes of a single IDT as well as in areas between different IDTs. Such areas are referred to herein as the active areas of the SAW device.

As shown in FIG. 2a, IDT 27 includes bus bars 26a and 26b having a plurality of electrodes 28a and 28b respectively extending therefrom. Although the plurality of electrodes 28a and 28b as well as bus bars 26a and 26b are spaced apart and, therefore, are not electrically connected, IDT 27 as a whole may collectively represent one of device elements 24. The distinction between the components of IDT 27 is not shown in FIG. 1 such that the drawing may be applicable for MEMS device fabrication as well as SAW device fabrication. In some embodiments, device elements 24 may include similar component configurations. In other cases, however, device elements 24 may have different configurations of components. In any case, the spacing, length, width and quantity of electrodes within an IDT may generally affect the conversion of electrical field energies to mechanical wave energies and vice versa and, therefore, may affect the performance of the ensuing SAW device. As such, it is noted that IDT 27 is exemplary and, therefore, other IDT configurations known in the SAW device industry may be employed for the integrated circuits described herein, including those that utilize piezoelectrically-coupled Rayleigh waves as well as those that utilize non-Rayleigh waves. In particular, IDTs having different quantities, lengths, widths and/or spacings of electrodes than electrodes 28a and 28b shown in FIG. 2a may be employed.

It is further noted that FIG. 2a illustrates an exemplary configuration of components for device elements 24 and, therefore, one or both of device elements 24 may include alternative component configurations. For example, one or both of device elements 24 may include a plurality of IDTs in some embodiments. Furthermore, one or both of device elements 24 may include reflectors. In some embodiments, the configuration of components within a SAW device may depend on its application and, as such, the integrated circuit described herein may include any application of SAW devices, including bandpass filters and any other applications known in the industry. In turn, the dimensions and compositions of SAW device components included in the integrated circuit described herein may be in accordance with design specifications for the ensuing device. In addition, the SAW device components may generally be formed by techniques known in the microelectronic fabrication industry including, for example, deposition, photolithographic, and etching processes.

Figure 11:
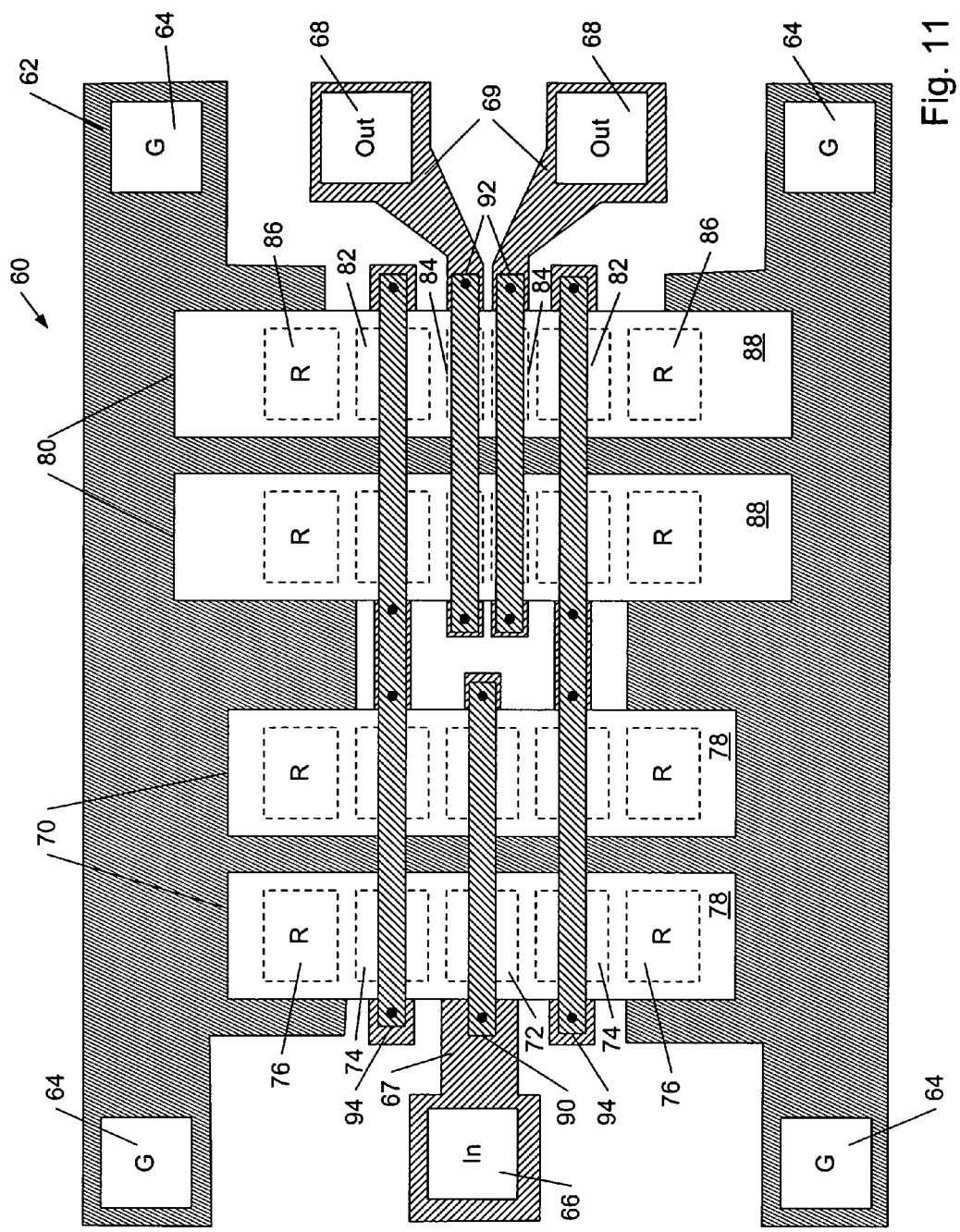
FIG. 11 is a partial top view of an exemplary surface acoustic wave device having conductive features formed over tracks of the device.

As noted above, IDTs are used in SAW devices to convert electrical field energies to mechanical wave energies and vice versa. In particular, the conversion of electrical field energies to mechanical waves and vice versa within a SAW device may be directed along a track of IDTs. The term "track," as used herein, may generally refer to a compilation of SAW device IDTs, some of which are used to primarily convert a receiving electric field energy into a mechanical wave energy and others which are used to primarily convert the mechanical wave energy into an output electric field energy. In some embodiments, one of device elements 24 illustrated in FIG. 1 may be configured to primarily convert a receiving electric field energy into a mechanical wave energy and the other of device elements 24 may be configured to primarily convert the mechanical wave energy into an output electric field energy. In such cases, device elements 24 may collectively serve as a track. In other embodiments, however, one or both of device elements 24 may be individually configured as one or more tracks. For instance, one or both of device elements 24 may include a plurality of IDTs with which to convert electrical field energies to mechanical wave energies and vice versa. An exemplary SAW device including multiple tracks arranged upon a substrate is illustrated in FIG. 11 and described in more detail below.

Turning to FIG. 2b, an exemplary configuration of components which may be used for a MEMS device is shown. In particular, FIG. 2b illustrates an expanded view of one of device elements 24 showing beam 30 supported by structure 32 and suspended above gate 34 and contact pad 36. The distinction of such components is not shown in FIG. 1 such that the drawing may be applicable for SAW device fabrication as well as MEMS device fabrication. As noted above, the term "MEMS devices" as used herein may generally refer to microelectronic devices which integrate electromechanical functions using moving structures. In regard to the configuration of components illustrated in FIG. 2b, the application and release of voltages to gate 34 may move beam 30 relative to contact pad 36 and, therefore, may serve as a MEMS device. It is noted that the MEMS device may include additional components which are not depicted in the cross-sectional view of FIG. 2b. Moreover, alternative component configurations of MEMS devices known to those skilled in the MEMS device industry may be incorporated into one or both of device elements 24 and, therefore, the integrated circuits described herein are not restricted to the MEMS structure depicted in FIG. 2b. For instance, one or both of device elements 24 may include a plurality of beams, support structures, gates and/or contact structures.

In some embodiments, device elements 24 may include similar configurations of MEMS components. In other cases, however, device elements 24 may have different configurations of MEMS components. In either case, device elements 24 may, in some embodiments, be configured to function together. In other words, device elements 24 may collectively serve as a single MEMS device. In other embodiments, device elements 24 may be configured to function as separate MEMS devices. In either case, the dimensions and compositions of the components may be in accordance with design specifications generally known in the MEMS fabrication industry. Exemplary materials for the components may include but are not limited to gold, copper, titanium, tungsten, or alloys of such metals. In some embodiments, one or more of the MEMS components may additionally include dielectric materials. In any case, the MEMS device components may generally be formed by techniques known in the microelectronic fabrication industry including, for example, deposition, photolithographic, and etching processes.

Figure 3:
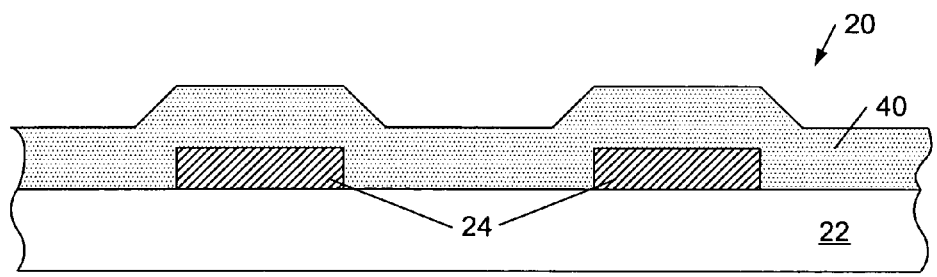
FIG. 3 is a partial cross-sectional view of the topography depicted in FIG. 1 subsequent to the deposition of a sacrificial layer upon the device elements.

Regardless of whether device elements 24 makeup a SAW device or a MEMS device, the method of fabrication described herein may continue to FIG. 3 in which sacrificial layer 40 is deposited onto topography 20. As shown in FIG. 3, sacrificial layer 40 may, in some embodiments, be deposited conformably, such that its upper surface mimics the underlying contour of topography 20. In other embodiments, sacrificial layer 40 may be deposited such that a substantially planar surface is formed. In either case, sacrificial layer 40 may, in some embodiments, be polished subsequent to deposition. In general, the thickness of sacrificial layer 40, as deposited or subsequent to polishing, may be between approximately 4000 angstroms and approximately 2 microns and more generally, between approximately 8000 angstroms and approximately 1 micron. Larger or smaller thicknesses for sacrificial layer 40 may be employed, however, depending on the design specifications of the ensuing device.

In general, sacrificial layer 40 may include a material having substantially different etch characteristics to that of the materials of base substrate 22 and device elements 24, particularly in reference to the etch chemistry used to pattern the sacrificial layer described below in reference to FIG. 4. In addition, sacrificial layer 40 may include a material having substantially different etch characteristics to that of a subsequently deposited sealing layer, particularly in reference to the process used to remove remaining portions of sacrificial layer 40 relative to the sealing layer as described below in reference to FIG. 6. Some exemplary materials for sacrificial layer 40 are discussed below, but the method described herein is not necessarily so restricted. Consequently, other materials may, in some embodiments, be considered for sacrificial layer 40.

In some embodiments, sacrificial layer 40 may include polysilicon. The use of polysilicon as a sacrificial material has an advantage that its deposition may increase either the bulk or surface conductivity of substrate materials used for SAW devices, such as lithium niobate or lithium tantalate, for example. This is due to a chemical reduction process that is known to occur when these substrate materials are heated in vacuum. In particular, the chemical reduction process may produce a thin skin of chemically reduced material of readily oxidized silicon having increased conductivity on the surface of the base substrate. This increased conductivity can be valuable in suppressing the build up of charge on these substantially insulating substrates which occurs due to a pyroelectric effect. For example, lithium tantalate can build up thousands of volts of pyroelectrically-induced charge during temperature changes and this built-up charge can potentially degrade the performance of a SAW device. In particular, built-up charge on a lithium tantalate substrate may damage the IDT structures or may form microscopic domains of reversed crystal orientation in the SAW active area. In some embodiments, built-up charge on a lithium tantalate substrate may damage the wafer even to the point of fracture since pyroelectrically-induced voltages may exceed the breakdown voltage of the substrate material. Consequently, using polysilicon sacrificial layers in fabricating SAW devices may result in devices with superior resistance to these deleterious pyroelectric effects.

In order to avoid adversely affecting the material of base substrate 22 during the deposition of polysilicon, sacrificial layer 40 may, in some embodiments, be deposited at temperatures above the Curie temperature of the base substrate material. For example, in embodiments in which base substrate 22 includes lithium tantalate, sacrificial layer 40 may be deposited around 550° C., since the Curie temperature of congruent lithium tantalate is about 600° C. and the Curie temperature for stoichiometric lithium tantalate is about 695° C. Smaller or larger temperatures, however, may be used for the deposition of polysilicon for sacrificial layer 40, depending on the specifications of the fabrication process and the composition of the base material. For example, sacrificial layer 40 may, in some cases, include polysilicon when device elements 24 include MEMS device components. In such cases, the substrate materials used for MEMS devices may not, in some embodiments, include magnetic materials and, therefore, may not include a Curie temperature reference at which to avoid adverse affects as compared to those materials used for SAW devices. Consequently, polysilicon may, in some embodiments, be deposited at higher temperatures than those mentioned above. In other cases, polysilicon may be deposited at lower temperatures than those mentioned above to lower the thermal budget of the fabrication process.

Although polysilicon offers advantages for SAW devices in some cases, other materials for sacrificial layer 40 may be used, including embodiments in which topography 20 includes SAW devices or MEMS devices. For example, sacrificial layer 40 may, in some embodiments, include amorphous silicon. Amorphous silicon may generally be deposited at a lower temperature than polysilicon and, therefore, may advantageously offer a manner in which to lower the thermal budget of the fabrication process. For example, amorphous silicon may be deposited at temperatures as low as 50° C. using sputter deposition techniques. A further benefit of using amorphous silicon for sacrificial layer 40 is it may be dry etched in a highly selective manner using xenon difluoride gas, which is described below in reference to FIG. 6 as an etch chemistry which may be used to remove portions of sacrificial layer 40 from under a subsequently deposited sealing layer.

In yet other embodiments, sacrificial layer 40 may be a polymer material, such as polyimide, photoresist, or polymethyl methacrylate (PMMA), for example. These polymer sacrificial materials may be beneficial when low temperature processing is needed through the sealing process described below. The use of polymer materials for sacrificial layer 40 may, in some embodiments, have disadvantages and, therefore, the pros and cons of using such materials may need to be weighed for design specifications of the device. A disadvantage of using polymer materials for sacrificial layer 40 may include difficulty of removing the material from an area with significant lateral dimensions due to the directional nature of plasma etching needed to etch the material. In addition, some polymer materials may include impurities that fail to react with plasma etch chemistries, thereby leaving a residue. The formation of such residue may not be an issue with PMMA, however. Furthermore, polymer materials may facilitate the formation of water molecules that adsorb to the surfaces inside an enclosed area and may prevent hermeticity due to the moisture.

Figure 4:
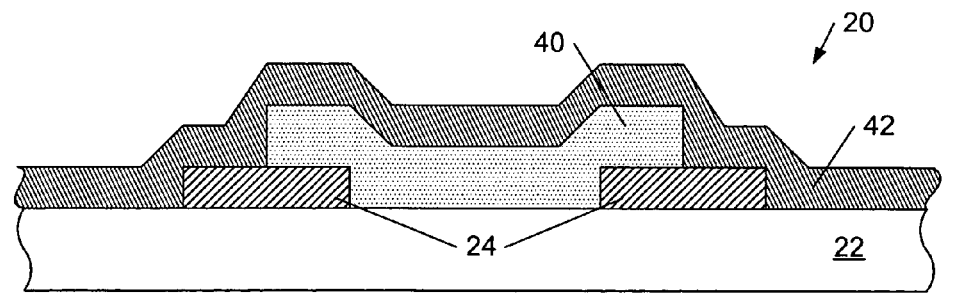
FIG. 4 is a partial cross-sectional view of the topography subsequent to the deposition of a sealing layer upon a patterned portion of the sacrificial layer deposited in FIG. 3.

Subsequent to its deposition, sacrificial layer 40 may be patterned as illustrated in FIG. 4. The patterning process may generally include lithography techniques known to those skilled in microelectronic fabrication. As shown in FIG. 4, sacrificial layer 40 may be patterned such that portions of device elements 24 are exposed. In this manner, electrical contact may be made to device elements 24, such as for coupling to input/output pads or ground contacts. In some embodiments, the exposed portions of device elements 24 may include all or portions of bus bars of an IDT within a SAW device. Alternatively, the exposed portions of device elements 24 may include portions of a contact pad or extensions from a support structure within a MEMS device. In yet other embodiments, the exposed portions of device elements 24 may include line traces which are configured for coupling to input/output pads or ground traces of either a MEMS device or a SAW device.

In addition to exposing portions of device elements 24, sacrificial layer 40 may be patterned such that portions of the sacrificial material remain over a portion of the microelectronic device. In particular, sacrificial layer 40 may be patterned such that portions of the material remain over regions of the device in which mechanical motion will be detected, referred to herein as active areas. For example, in embodiments in which device elements 24 include SAW devices, sacrificial layer 40 may be patterned such that portions of the material remain over areas between IDTs and areas between electrodes of the IDTS, since it is these regions over which waves will be propagated. In embodiments in which device elements 24 include MEMS devices, sacrificial layer 40 may be patterned such that portions of the material remain over areas having structures configured to move.

As shown in FIG. 4, patterned portions of sacrificial layer 40 remain over the area between device elements 24. As such, in some embodiments, the area between device elements 24 may be active. In other embodiments, the area may not be active. In such cases, sacrificial layer 40 may alternatively be patterned to expose a portion of the area between device elements 24. Thus, the pattern in which sacrificial layer 40 is formed may depend on the design specifications of the device/s comprising device elements 24. Consequently, sacrificial layer 40 may, in some embodiments, be patterned in different patterns than the one shown in FIG. 4. For instance, sacrificial layer 40 may, in some embodiments, be patterned with vias formed in the area between device elements 24, but exterior to the active areas of the device. The formation of vias may, for example, be advantageous for forming support posts for the subsequently formed sealing structure. In particular, since sacrificial layer 40 will be removed subsequent to the deposition of a sealing layer as described below in reference to FIG. 7, vias extending through portions of sacrificial layer 40 may allow a sealing material to be deposited therein to form posts with which to support the sealing structure over the open-space cavity. Such support structures may be particularly advantageous in embodiments in which a relatively large area of base substrate 22 will be sealed.

As illustrated in FIG. 4, sealing layer 42 may be deposited over the patterned portion of sacrificial layer 40 as well as over the exposed portions of device elements 24 and base substrate 22. As with sacrificial layer 40, sealing layer 42 may, in some embodiments, be deposited conformably as shown in FIG. 4, such that its upper surface mimics the underlying contour of topography 20. In other embodiments, sealing layer 42 may be deposited such that a substantially planar surface is formed. In either case, sealing layer 42 may, in some embodiments, be polished subsequent to deposition. In general, the thickness of sealing layer 42 may be sufficient to be impermeable to contaminants and moisture and, therefore, may depend on the material composition. An exemplary thickness range for sealing layer 42, as deposited or subsequent to polishing, may, however, generally be between approximately 0.8 microns and approximately 2 microns, and in some cases, approximately 1.6 microns. Larger or smaller thicknesses for sealing layer 42 may be employed, however, depending on the design specifications of the ensuing device.

In general, sealing layer 42 may include a material having substantially different etch characteristics to that of the materials of base substrate 22 and device elements 24, particularly in reference to the etch chemistry used to pattern the sealing layer described below in reference to FIG. 5. In addition, sealing layer 40 may include a material having substantially different etch characteristics to that of sacrificial layer 40, particularly in reference to the process used to remove remaining portions of sacrificial layer 40 relative to the sealing layer as described below in reference to FIG. 6. Furthermore, the material of sealing layer is preferably impermeable to contaminants and moisture. In some cases, the proximity and electrical characteristics of sealing layer 42 for applications of SAW devices may need to be considered for material selection of the sealing layer as well. Exemplary materials for sealing layer 42 may include spin-on-glass, a sputtered glass, metal or silicon dielectric materials. The method described herein, however, is not necessarily so restricted. Consequently, other materials may, in some embodiments, be considered for sealing layer 42. The term, "silicon dielectric materials" is used herein to refer to dielectric materials including silicon, such as silicon oxide, silicon nitride and silicon oxynitride, for example. Such materials, as well as glass materials, may be advantageous for insulating device elements 24 from conductive features subsequently formed overlying sealing layer 42. Alternatively, a metal material for sealing layer 42 may advantageously provide electrical connection between such features.

Figure 5:
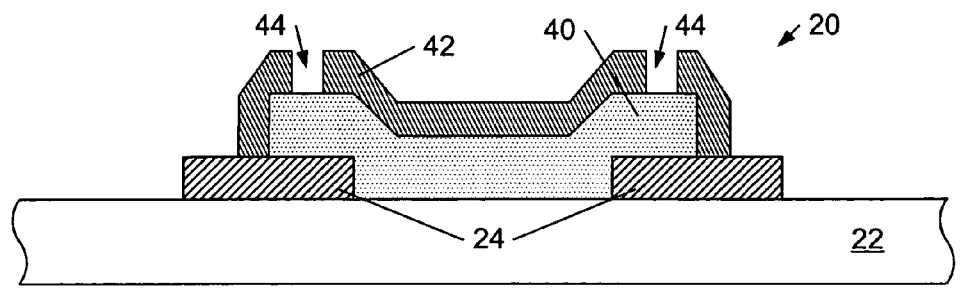
FIG. 5 is a partial cross-sectional view of the topography subsequent to the patterning of the sealing layer deposited in FIG. 4.

FIG. 5 illustrates the patterning of sealing layer 42, exposing portions of base substrate 22 and portions of device elements 24. In this manner, electrical contact may be subsequently made to device elements 24, such as for coupling to input/output pads or ground contacts. The patterning process may generally include lithography techniques known to those skilled in microelectronic fabrication. As shown in FIG. 5, the patterning process may form openings 44 within sealing layer 42, exposing portions of sacrificial layer 40. In general, the dimensions of openings 44 may be sufficient to allow an etch chemistry to slip therethrough to remove remaining portions of sacrificial layer 40, which is described in more detail below in reference to FIG. 6. In some cases, the dimensions may be optimized such that openings 44 may be efficiently closed subsequent to the removal of sacrificial layer 40, which is described in more detail below in reference to FIG. 7. In general, openings 44 may include a width smaller than a length, the width dimension having a higher correlation to efficiently removing sacrificial layer 40 as well as subsequently plugging openings 44. Although the dimensions of openings 44 may depend on the area of topography 20 covered by sealing layer 42 and the placement of the openings across the sealing layer, exemplary dimensions may include a width between approximately 0.4 microns and approximately 1.0 micron, or more specifically about 0.8 micron. In addition, exemplary dimensions of a length for openings 44 may be between approximately 5 microns and approximately 20 microns, or more specifically about 10 microns.

In some embodiments, openings 44 may be formed in areas which do not overly the active areas of the device. Such placement of openings 44 may be advantageous for preventing contamination of the active areas, particularly during the subsequent process of filling the openings as described in more detail below in reference to FIG. 7. In some embodiments, openings 44 may be formed at a lateral distance of up to approximately 5 microns from the active areas. FIG. 5 shows openings 44 over device elements 24, but such placement is exemplary. In particular, openings 44 may be formed over other areas of the topography, including the area between device elements 24 when such an area is not active. It is noted that, in some embodiments, the areas between device elements 24, particularly at the cross-sectional line along which FIG. 5 is shown, may be an active area. In particular, the area between device elements 24 may be configured for the transmission of acoustical waves between the device elements. In such cases, topography 20 may be configured with areas which are not active on either side of the cross-sectional line depicted in FIG. 5 and openings 44 may alternatively be placed over such areas. It is further noted that the areas between individual components of one or both of device elements 24 may additionally or alternatively be active areas and, therefore, it may not be advantageous to place openings 44 over device elements 24 in some embodiments. In such cases, openings 44 may be placed over regions of topography 20 which do not include device elements 24.

Figure 6:
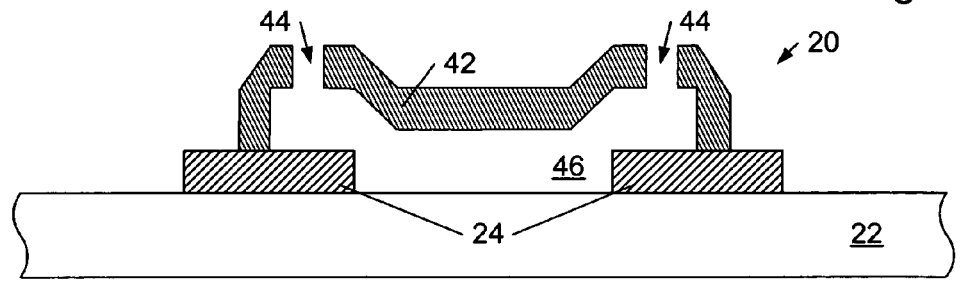
FIG. 6 is a partial cross-sectional view of the topography having the patterned portion of the sacrificial layer removed subsequent to the patterning of the sealing layer in FIG. 5.

Turning to FIG. 6, remaining portions of sacrificial layer 40 are removed through openings 44 to create cavity 46. Such a removal process is preferably etch selective to the material of sacrificial layer 40 over the material of sealing layer 42 such that a sufficient portion of sealing layer 42 may remain to surround cavity 46. As described above, openings 44 may be bound and, therefore, the central portion of sealing layer 42 shown in FIG. 6 may be suspended over cavity 46. In some embodiments, the removal of remaining portions of sacrificial layer 40 may be conducted by a dry etching process that does not leave undesirable residue. Leaving the acoustically active portion of a SAW device free of the surface residue prevents adverse alterations to wave propagation characteristics. In addition, a MEMS device free of surface residue inhibits the modification of the voltage level at which a moving part with a MEMS device is brought into contact or released from a contact pad. As a consequence, device performance may not be degraded for the SAW device or MEMS device comprising device elements 24.

An exemplary dry etch process which may be particularly effective for embodiments in which sacrificial layer 40 includes polysilicon involves exposing topography 20 to an ambient of xenon difluoride ($XeF_2$) and is referred to herein as a "$XeF_2$ release process." In particular, a $XeF_2$ release process may be substantially selective to etching polysilicon without substantially etching other materials, such as silicon dielectric materials for example. Consequently, in embodiments in which sealing layer 42 includes a silicon dielectric material, the $XeF_2$ release process may not remove substantial portions of the layer. In addition, the $XeF_2$ release process may generally be less reactive with metallic materials than polysilicon and, therefore, such a removal process may be advantageous in embodiments in which sealing layer 42 includes a metal material. In both cases, the $XeF_2$ release process removes the sacrificial material without leaving a substantial residue on the surface of the wafer, which as noted above, may cause degradation of the device.

In general, the $XeF_2$ release process may include purging a chamber comprising topography 20 with a gas such as nitrogen, for example, prior to exposing topography 20 with $XeF_2$. The chamber may include the vessel in which sealing layer 42 was patterned or may include a different vessel. In either case, the chamber may be subsequently evacuated down to a moderate vacuum. The $XeF_2$ may be sublimated in a separate container to a pressure of about 4 mTorr (i.e., the vapor pressure of $XeF_2$) and then introduced into the chamber comprising topography 20 to remove remaining portions of sacrificial layer 40. In some embodiments, the $XeF_2$ release process may be performed in vapor phase at a pressure of approximately 60 mTorr, at room temperature and with no external energy sources. Larger or smaller pressures and temperatures, however, may be used for the $XeF_2$ release process as well as with the use of external energy sources in some cases.

It is noted that although the removal of the remaining portions of sacrificial layer 40 is described specifically with reference to the $XeF_2$ release process and the sacrificial layer including polysilicon, the method is not necessarily restricted to such materials or the use of the $XeF_2$ release process. In particular, the method described herein may be used with any of the materials noted above for the respective structures and layers of topography 20, including amorphous silicon or polymers for sacrificial layer 40. In addition, the method may include other release processes which are configured to be highly selective to the material of sacrificial layer 40 and substantially non-selective to the material of sealing layer 42.

In some embodiments, cavity 46 may be filled with one or more gases prior to plugging openings 44, a process which is described in more detail below in reference to FIG. 7. In particular, cavity 46 may be pressurized by placing topography 20 in a sputtering, evaporating or other vacuum chamber pumped down to a target pressure. More specifically, one or more gases, such as argon or any other noble gases, may be introduced in a chamber comprising topography 20 and brought to equilibrium such that the gas pressure with cavity 46 is the same as the gas pressure external to the cavity. Such a pressurized atmosphere may aid in supporting sealing layer 42 over cavity 46. In other embodiments, the method may not include filling cavity 46 with gases and, therefore, the method may continue to FIG. 7 subsequent to removing sacrificial layer 40.

Figure 7:
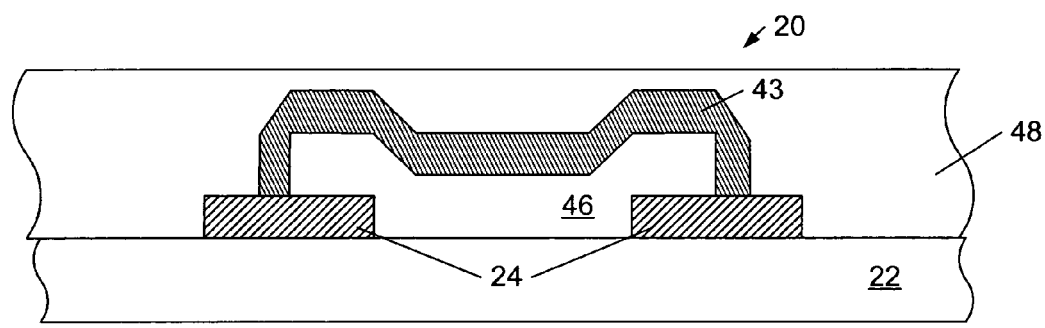
FIG. 7 is a partial cross-sectional view of the topography in which the holes in the sealing layer have been filled to form a sealed cavity and a dielectric layer has been deposited subsequent to the removal of the patterned portion of the sacrificial layer in FIG. 6.

FIG. 7 illustrates openings 44 within sealing layer 42 filled such that cavity 46 is sealed by sealing structure 43. In general, openings 44 may be filled with a material sufficient to prevent the permeation of contaminants or moisture therethrough. For example, openings 44 may be filled with a silicon dielectric material or a metal material. In some embodiments, the material used to fill openings 44 may be same material as sealing layer 42. In other embodiments, however, the material used to fill openings 44 may be a different material than sealing layer 42. In either case, the deposition of the material used to fill openings 44 may include any deposition technique known to those skilled in microelectronic fabrication.

For example, sputtering techniques may be used to fill openings 44, particularly when configured to be isotropic in nature. In particular, an isotropic sputter deposition process may coat the rims of openings 44, building up material until the holes are sealed. The isotropic nature of such a process, however, will inevitably introduce some of the fill material into cavity 46. If the sputtered material lands on active regions of the underlying device, its performance may be degraded. To avoid this detrimental effect, openings 44 may be purposely positioned over inactive areas of the device as described above in reference to FIG. 5. Alternatively, evaporation deposition techniques may be used to fill openings 44. Since evaporation tends to be highly directional in nature, it may be advantageous to position the beam at an angle to topography 20 such that openings 44 may be filled without introducing a significant amount of material into cavity 46. An additional advantage of evaporation is that a higher vacuum may be achieved in an evaporation chamber in comparison to a sputtering chamber.

In general, plugging openings 44 may form sealing structure 43, which, as noted above, may include materials specifically configured to serve as a hermetic seal, preventing the permeation of contaminants and moisture therethrough. In some embodiments, the hermeticity of sealing structure 43 can be enhanced by coating it with a film of silicon nitride (not shown) deposited using plasma-enhanced chemical vapor deposition (PECVD), although such an additional film is not necessarily needed.

Subsequent to the filling openings 44, dielectric layer 48 may be deposited upon topography 20 as shown in FIG. 7. Such a dielectric layer may include dielectric materials such as but not limited to silicon dioxide, silicon nitride and silicon oxynitride. As shown in FIG. 7, dielectric layer 48 may be formed to a thickness such that its upper surface is spaced above the uppermost surface of sealing structure 43. In this manner, sealing structure 43 may be isolated from conductive features subsequently formed thereover. In other embodiments, however, dielectric layer 48 may be formed coplanar with a portion of sealing structure 43 such that conductive features may be formed thereon. In yet other cases, dielectric layer 48 may not be formed and a conductive layer may be deposited in replace thereof. Such sequence of process steps may also be used to form conductive features upon sealing structure 43. In some cases, sealing layer 42 may include a conductive material and, therefore, the formation of conductive features thereon may be particularly beneficial for using sealing structure 43 for electrically connecting such features with device elements 24. In other embodiments, however, sealing layer 42 may not include a conductive material and, therefore, sealing structure 43 may not be used to electrically connect overlying features with device elements 24.

Figure 8:
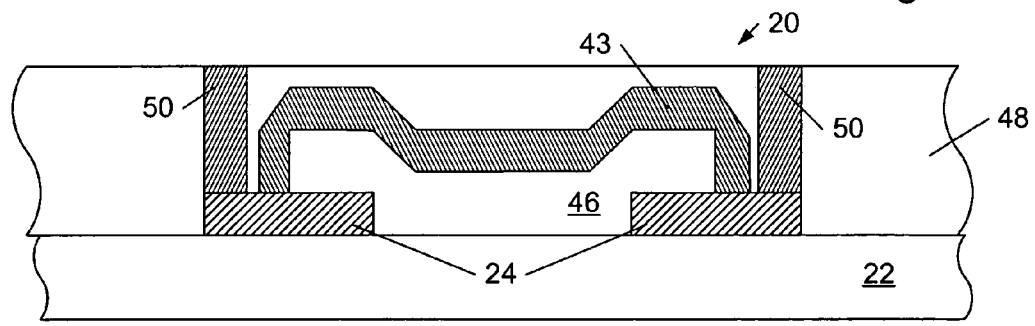
FIG. 8 is a partial cross-sectional view of the topography subsequent to the formation of contacts within the dielectric layer deposited in FIG. 7.

As shown in FIG. 8, vias 50 may be formed within dielectric layer 48 when such a layer is deposited. Vias 50 may generally be formed by patterning openings within dielectric layer 48 and subsequently filling the openings with a conductive material, such as but not limited to aluminum, copper, gold, titanium, tungsten and metal alloys thereof. As shown in FIG. 8, vias 50 may be formed upon upper portions of contact elements 24 arranged exterior to cavity 46. In this manner, vias 50 may be used to electrically connect subsequently formed overlying conductive features to device elements 24. In other embodiments, vias 50 may be formed upon other conductive features of topography 20, such as contact pads coupled to input/output pads or ground pads of the topography, or may be formed upon the upper surface of base substrate 22. In such cases, vias 50 may or may not be used to electrically connect subsequently formed overlying conductive features to device elements 24. In particular, vias 50 may, in some embodiments, be used to connect to devices formed upon topography 20 which function independent of the device disposed within cavity 46. As noted above, dielectric layer 48 may not, in some embodiments, be formed and, therefore, vias 50 may not be formed in some cases.

Figure 9:
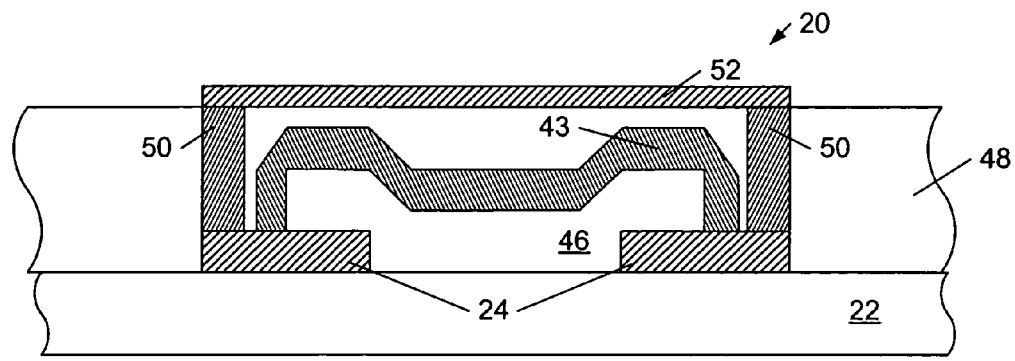
FIG. 9 is a partial cross-sectional view of the topography in which a patterned conductive device has been formed above the sealed cavity subsequent to the formation of the contacts in FIG. 8.

Regardless of whether dielectric layer 48 and vias 50 are formed, the method described herein may include the formation of a conductive feature above sealed cavity 46. In general, the formation of the conductive feature may include depositing a conductive material, such as but not limited to aluminum, copper, gold, titanium, tungsten and metal alloys thereof, upon topography 20. Thereafter, the deposited material may be patterned according to design specifications of the device. The patterning process may generally include lithography techniques known to those skilled in microelectronic fabrication. In some embodiments, the formation of such a conductive feature may be upon dielectric layer 48 and vias 50 as shown by conductive feature 52 in FIG. 9. In addition or alternatively, conductive feature 52 may be formed upon sealing structure 43. In any case, conductive feature 52 may be formed directly above and sometimes spanning sealing structure 43 as shown in FIG. 9.

In general, conductive feature 52 may be a conductive device or a partial portion of a conductive device used to enhance the integrated circuit formed from topography 20. In some embodiments, conductive feature 52 may be used in conjunction with the device formed within cavity 46 and, therefore, may be electrically connected to device elements 24. In other embodiments, conductive feature 52 may be used independent of the device formed within cavity 46 and, therefore, may not be electrically connected to device elements 24. In either case, conductive feature 52 may serve as an interconnect line. In other embodiments, conductive feature 52 may be used to form other conductive devices, such as but not limited to capacitors, inductors, interconnects, resistors, shields and electro static discharge protection structures. The thickness and lateral dimensions of conductive feature 52 may generally depend on the design specifications of the ensuing integrated circuit and, therefore, may vary for different applications.

Figure 10:
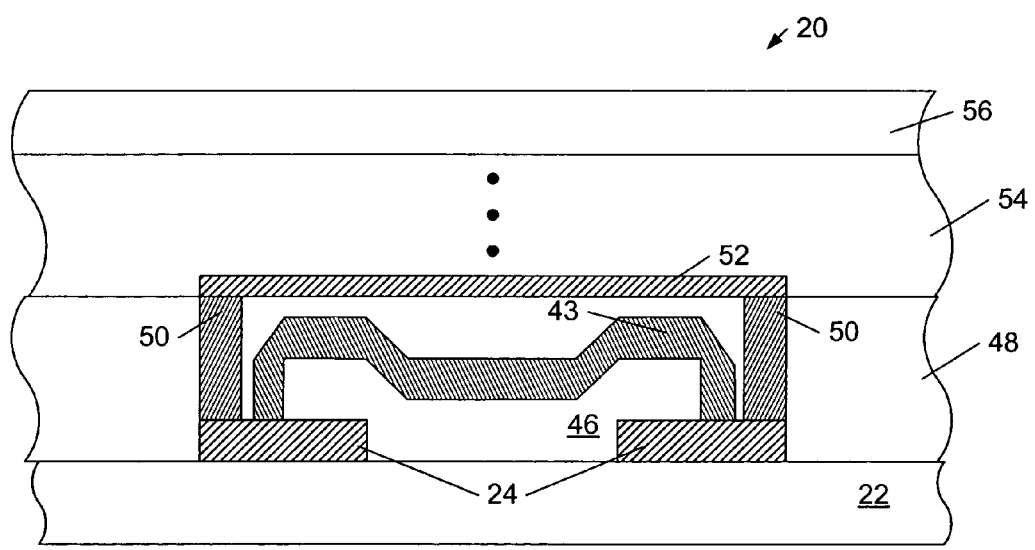
FIG. 10 is a partial cross-sectional view of the topography in which multiple layers of conductive features and interlevel dielectric layers as well as an overlying passivation layer have been formed above the patterned conductive feature formed in FIG. 9.

FIG. 10 illustrates the formation of additional layers 54 above conductive feature 52. In general, additional layers 54 may include any number of layers and/or structures which may be used to fabricate the ensuing integrated circuit from topography 20. In some cases, additional layers 54 may include conductive features formed by deposition, photolithographic, and etching processes known in the microelectronic fabrication industry. In this manner, an integrated circuit may be fabricated including multiple levels of conductive features formed above a sealed cavity. The conductive features are depicted in FIG. 10 by the continuation dots extending above conductive features, indicating that any number of conductive features may be formed thereover. As noted above, the multiple levels of conductive features within topography 20 may form conductive devices, such as but not limited to capacitors, inductors, interconnects, resistors, shields and electro static discharge protection structures. In some cases, additional layers 54 may further include inter-level dielectric materials to insulate the conductive devices disposed therein as well as conductive feature 52. Other layers and materials may also be included within additional layer 54 for the formation of the conductive devices, depending on the design specifications of the device. In some embodiments, additional layers 54 may not be formed upon conductive feature 52 and, consequently, an integrated circuit formed from topography 20 may only include a single level of metallization formed above cavity 46.

Regardless of whether additional layers 54 are formed within topography 20, passivation layer 56 may be deposited on the upper surface of the topography to prevent permeation of contaminants and moisture to the conductive features disposed above cavity 46. In some embodiments, passivation layer 56 may also prevent permeation of contaminants and moisture into cavity 46. Examples of suitable dielectric materials for passivation layer 56 include silicon nitride, polyimide, spun on glass, silicon dioxide and silicon carbide, but other passivation materials known in the microelectronics industry for sealing integrated circuitry on a chip may be used. Subsequent to the deposition of passivation layer 56, bond pads may be patterned therein such that the topography may be wire-bonded or surface mounted to a substrate carrier.

In accordance with the present disclosure, sealing structure 43 enables the addition of multiple levels of metal over a SAW device or a MEMS device and the substrate upon which such devices are formed. The addition of one or more levels of metallization in turn enables the creation of interconnects and other conductive structures that were previously unrealizable at the chip level. This integration further enables the die size to be reduced. Furthermore, the multiple levels of conductors over mechanical active area enables the construction of various integrable components on the same substrate as SAW or MEMS devices. For example, in some embodiments, SAW device and MEMS devices may be fabricated on the same substrate. In addition or alternatively, thin film transistors may be formed on a substrate with SAW and/or MEMS devices.

In addition to the aforementioned benefits, the formation of conductive devices over a SAW device may add functionality to an integrated circuit by enabling tracks of the SAW device to be split and, consequently, increase performance. As noted above, the spacing, length, width and quantity of electrodes within an IDT may generally affect the conversion of electrical field energies to mechanical wave energies and vice versa and, therefore, may affect the performance of the ensuing SAW device. The size of the electrodes and, more particularly, the length of the electrodes are generally limited by the parasitic resistance of the electrodes. The formation of conductive devices over SAW devices may allow tracks to be arranged side by side and in close enough proximity such that IDTs within one or more of the different tracks may be coupled to a single input and/or output trace and the mechanical waves converted or received from the IDTs may be partially aggregated. Such a "split track" configuration effectively allows IDTs within the tracks to operate as a single IDT with longer electrodes than each IDT may individually comprise. As a result, the performance of the device may be improved.

FIG. 11 illustrates an exemplary circuit employing a configuration of "split tracks" for a SAW device. It is noted, however, the concept of "split tracks" is not limited to the configuration depicted in FIG. 11. In particular, the concept of "split tracks" may be integrated within any SAW device design, including those with more or less tracks than the circuit illustrated in FIG. 11. Moreover, the quantity, placement and connection of conductors integrated over SAW devices are not restricted to the configuration of conductors illustrated in FIG. 11. In particular, the circuit illustrated in FIG. 11 is presented as an example of how conductors may be used to enhance the functionality of a SAW device, particularly with regard to connecting IDTs of neighboring tracks such that the parasitic resistance limitations on the lengths of electrodes may be superseded.

As shown in FIG. 11, circuit 60 may include sets of tracks 70 and 80. For the description of circuit 60, each set of tracks reference by numbers 70 and 80 may represent a set of split tracks. It is noted that circuit 60 is not restricted to two sets of split tracks, nor are each set of split tracks restricted two tracks. In particular, circuit 60 may include any number of split track sets, including one or more than one, and the split track sets may include any plurality of tracks. It is further noted that circuit 60 may, in some embodiments, include tracks which are not split. As shown in FIG. 11, the split-tracks within tracks 70 and 80 may each include a similar configuration of components. Circuit 60, however, is not necessarily so restricted. In particular, one or both of track sets 70 and 80 may include individual split-tracks with a different set of components. As such, circuit 60 is not necessarily limited to the illustration of FIG. 11.

The components within each of track sets 70 and 80 are outlined by a dotted line indicating they are arranged below sealing structures 78 and 88, respectively. Sealing structures 78 and 88 may be formed similar to sealing structure 43 described above in reference to topography 20 and, therefore, may serve to seal the components with a cavity and prevent the permeation of contaminants or moisture therein. It is noted that other components of circuit 60, such as the conductors 90, 92 and 94, ground contacts 64 and input/output pads 66 and 68 as well as other components are not shown underlying dielectric layers or a passivation layer. Dielectric and passivation layers have been omitted from FIG. 11 to illustrate the integration of split-tracks within a SAW device, but should not be presumed to be omitted from circuit 60. As will be described in more detail below, each track within track sets 70 may include an IDT configured to primarily convert an incoming electric field energy to a mechanical wave energy and another IDT configured to primarily receive the mechanical wave energy and convert it to an output electric field energy. FIG. 11 illustrates each track including reflector components, respectively referenced for track sets 70 and 80 by numbers 76 and 86. It is noted that the inclusion, number and placement of such reflectors is exemplary. In addition, other components known for use in SAW devices may be additionally or alternatively included within the individual tracks of track sets 70 and 80.

As shown in FIG. 11, each of the split-tracks within track set 70 may include an IDT 72 interposed between two of IDTs 74. In the configuration of circuit 60, IDTs 72 are coupled to input pad 66 and, therefore, are configured to primarily convert an incoming electric field energy to mechanical wave energies. In general, the phrase "configured to primarily", as used herein, may refer to adaptations which are mainly or predominately used to perform a given function. It is noted, however, that IDTs 72 may convert mechanical wave energies to output electric field energies in some embodiments. As shown in FIG. 11, IDT 72 arranged in the left track of track set 70 is coupled to input pad 66 via trace 67. In such embodiments, IDTs 72 as well as IDTs 74 may be rotated 90° relative to the orientation depicted in FIG. 2a. Conductor 90 is also coupled to trace 67 by a via and spans over track set 70 to another via coupled to a contact pad disposed on the far side of the right track of track set 70. In this manner, the right track of track set 70 is coupled to input pad 66 as well. As shown in FIG. 11, ground trace 62 extends between the individual tracks of track sets 70 and 80, indicating bus bars arranged along the respective sides of the tracks are grounded. Consequently, IDTs 72 are configured to receive an electric field energy from input pad 66. As noted above, IDTs 72 are configured to primarily convert an incoming electric field energy to a mechanical wave energy. In turn, IDTs 74 are configured to primarily receive the mechanical wave energies generated from IDTs 72 in each respective track and convert the mechanical wave energies to output electric field energies.

As shown in FIG. 11, circuit 60 may include conductors 94 arranged over track set 70 and, more specifically, spanning over opposing IDTs 74 arranged within the individual tracks of track set 70. Conductors 94 may be coupled to underlying contact pads along the sides of the individual tracks of track set 70 by vias. Such a connection allows output electric field energies generated from IDTs 74 to aggregate along conductors 94 and be transmitted as input to track set 80. Each track of track set 80 includes IDTs 82 coupled to each of conductors 94. In particular, conductors 94 are coupled to contact pads arranged along the exteriors of sealing structures 88 by vias. The contact pads are coupled to IDTs 82 such that an incoming electric field energy may be received. As shown in FIG. 11, ground track 62 is interposed between the tracks of track set 80 and, therefore, IDTs 82 may be configured to primarily convert an incoming electric field energy to mechanical wave energies. It is noted, however, that IDTs 82 may convert mechanical wave energies to output electric field energies in some embodiments. Such mechanical wave energies may be collected by IDTs 84 and converted to electric field energies. Each of the tracks within track set 80 may include two of IDTs 84 to support a dual-output signal transmitted to output pads 68. As shown in FIG. 11, circuit 60 includes conductors 92 arranged over IDTs 84 and coupled to contact pads arranged along the sides of sealing structures 88. Consequently, the electric field energies generated from IDTs 84 may be aggregated and transmitted over traces 69 to output pads 68.

As noted above, the configuration of circuit 60 is exemplary. In particular, the concept of "split-tracks" may be configured with any SAW device configuration. In addition, circuit 60 is not limited to the number or placement of conductors 90, 92 and 94 to produce the split tracks. In particular, circuit 60 is not necessarily limited to coupling IDTs which are in substantial alignment with each other, nor is it limited to splitting all tracks within a device. Consequently, all or portions of conductors 90, 92 and 94 may be repositioned or may be omitted from circuit 60. In any case, additional conductive features may be formed above sealing structures 78 and 88 to enhance the operation of the integrated circuit as described above in reference to FIGS. 9 and 10 for topography 20.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents.

What is claimed is:

1. A surface acoustic wave (SAW) device, comprising:
   a track set comprising a plurality of laterally spaced tracks, each track of the plurality of laterally spaced tracks comprising a first interdigitated transducer and a second interdigitated transducer within an individual sealed cavity, said first transducer configured to convert an incoming electric field energy into a mechanical wave energy, and the second interdigitated transducer configured to receive mechanical wave energy from the first interdigitated transducer and to convert the received mechanical wave energy into an output electric field energy; and
   a first conductor arranged above and spanning across the sealed cavities of at least two tracks of the plurality of laterally spaced tracks, wherein the first conductor is coupled to the first interdigitated transducers of the at least two tracks.

2. The SAW device of claim 1, further comprising a second conductor arranged above and spanning across the sealed cavities of the at least two tracks, wherein the second conductor is coupled to the second interdigitated transducers of the at least two tracks.

3. The SAW device of claim 2, wherein the second conductor is further arranged above and spanning across the individual sealed cavities of additional tracks, and wherein the second conductor is coupled to the first interdigitated transducers of the additional tracks.

4. The SAW device of claim 3, further comprising a third conductor arranged above and spanning across the individual sealed cavities of the additional tracks, wherein the third conductor is coupled to the second interdigitated transducers of the additional tracks.

5. The SAW device of claim 1, wherein the first conductor is coupled to an input/output pad of the SAW device.

6. The SAW device of claim 1, further comprising a ground plane arranged between the plurality of laterally spaced tracks and extending along ends of the plurality of laterally spaced tracks.

7. A surface acoustic wave (SAW) device, comprising:
a first track set comprising:
  a plurality of laterally spaced first tracks, each first track within an individual sealed cavity, each first track comprising:
    a first interdigitated transducer configured to convert an incoming electric field energy into a mechanical wave energy;
    a second interdigitated transducer configured to receive the mechanical wave energy from the first interdigitated transducer and to convert the received mechanical wave energy into an output electric field energy; and
    a first conductor arranged above and spanning across the sealed cavities of at least two first tracks, wherein the first conductor is coupled to the first interdigitated transducers of the at least two first tracks;
a second track set comprising:
  a plurality of laterally spaced second tracks, each second track within an individual sealed cavity, each second track comprising:
    a third interdigitated transducer configured to convert an incoming electric field energy into a mechanical wave energy;
    a fourth interdigitated transducer configured to receive the mechanical wave energy from the third interdigitated transducer and to convert the received mechanical wave energy into an output electric field energy; and
    a second conductor arranged above and spanning across the sealed cavities of least two second tracks, wherein the second conductor is coupled to the fourth interdigitated transducers of the at least two second tracks;
a third conductor arranged above and spanning across the sealed cavities of the at least two first tracks and the at least two second tracks, wherein the third conductor is coupled to the second interdigitated transducers of the at least two first tracks and to the third interdigitated transducers of the at least two second tracks; and
an input/output pad coupled to the first interdigitated transducers of the at least two first tracks, and another input/output pad coupled to the fourth interdigitated transducers of the at least two second tracks.

8. The SAW device of claim 7, including a ground plane extending between and adjacent opposite ends of the first tracks.

9. The SAW device of claim 7, wherein:
in each first track, the first interdigitated transducer is arranged between the second transducer and a fifth interdigitated transducer configured to receive mechanical wave energy from the first interdigitated transducer and to convert the received mechanical wave energy into an output electric field energy;
in each second track, a further fourth interdigitated transducer configured to receive mechanical wave energy from a sixth interdigitated transducer in that second track and to convert the received mechanical wave energy into an output electric field energy; and
a further input/output pad coupled to the further fourth interdigitated transducer.

10. The SAW device of claim 9, including a ground plane extending between the first tracks, between the second tracks, and adjacent the ends of the first and second tracks.

* * * * *